US 8,493,763 B1

(12) United States Patent
Argyres

(10) Patent No.: US 8,493,763 B1
(45) Date of Patent: Jul. 23, 2013

(54) SELF-TIMED MATCH LINE CASCADING IN A PARTITIONED CONTENT ADDRESSABLE MEMORY ARRAY

(75) Inventor: Dimitri Argyres, San Jose, CA (US)

(73) Assignee: NetLogic Microsystems, Inc., Irvine, CA (US)

( * ) Notice: Subject to any disclaimer, the term of this patent is extended or adjusted under 35 U.S.C. 154(b) by 0 days.

(21) Appl. No.: 13/283,422

(22) Filed: Oct. 27, 2011

(51) Int. Cl.
*G11C 15/00* (2006.01)

(52) U.S. Cl.
USPC .......................................... 365/49.1; 365/49

(58) Field of Classification Search
None
See application file for complete search history.

(56) References Cited

U.S. PATENT DOCUMENTS

| 6,125,049 A | 9/2000 | Nataraj |
| 6,166,939 A | 12/2000 | Nataraj et al. |
| 6,191,969 B1 | 2/2001 | Pereira |
| 6,191,970 B1 | 2/2001 | Pereira |
| 6,243,280 B1 | 6/2001 | Wong et al. |
| 6,430,074 B1 | 8/2002 | Srinivasan |
| 6,804,133 B1 | 10/2004 | Khanna |
| 7,050,318 B1 | 5/2006 | Argyres |
| 7,113,415 B1 | 9/2006 | Khanna |
| 7,800,930 B1 | 9/2010 | Deshpande et al. |
| 7,852,652 B1 | 12/2010 | Fabry |
| 7,920,398 B1 | 4/2011 | Khanna et al. |
| 2003/0123269 A1* | 7/2003 | Gillingham et al. ............ 365/49 |

* cited by examiner

*Primary Examiner* — Hoai V Ho
*Assistant Examiner* — James G Norman
(74) *Attorney, Agent, or Firm* — Sterne, Kessler, Goldstein & Fox PLLC

(57) ABSTRACT

A CAM array includes a plurality of regular rows and a reference row. Each regular row is partitioned into a plurality of row segments, with each row segment including a number of CAM cells coupled to a corresponding match line segment. The reference row generates self-timed control signals for corresponding segments of the regular rows. Control circuits selectively enable a respective row segment in response to a logical combination of match results in a previous row segment and an associated one of the self-timed control signals.

30 Claims, 11 Drawing Sheets

| X | Y | Data value |
|---|---|---|
| 0 | 0 | Don't care |
| 0 | 1 | 1 |
| 1 | 0 | 0 |
| 1 | 1 | invalid |

SELF-TIMED MATCH LINE CASCADING IN A PARTITIONED CONTENT ADDRESSABLE MEMORY ARRAY

TECHNICAL FIELD

This invention relates generally to semiconductor memories and specifically to content addressable memories.

BACKGROUND

Content addressable memory (CAM) devices are frequently used in network switching and routing applications to determine forwarding destinations, to perform classification functions, to implement Quality of Service (QoS) functions, and other tasks associated with routing data packets across a network. More specifically, a CAM device includes a CAM array having a plurality of CAM cells organized in a number of rows and columns. Each row of CAM cells, which can be used to store a CAM word, is coupled to a corresponding match line that indicates match results for the row. Each column of CAM cells is typically coupled to one or more data lines or data line pairs that can be used to drive data into a selected CAM row during write operations and/or for providing a search key to the CAM rows during compare operations. During a compare operation, the search key (e.g., the comparand word) is provided to the CAM array and compared with the CAM words stored therein. For each CAM word that matches the search key, a corresponding match line is asserted to indicate the match condition, and a priority encoder determines the match address or index of the highest priority matching (HPM) entry in the CAM array.

The match lines in a CAM array are typically pre-charged to or towards VDD for each and every compare operation. Thus, for each row having a mismatch condition, an associated match line ML is first pre-charged high towards VDD and then discharged low to ground potential. Current flow associated with this charging and discharging of such match lines results in undesirable power consumption. Further, as the number of CAM cells in each row of a CAM array increases, capacitive loading on the match lines increases accordingly, which further increases power consumption. Thus, there is a need to reduce the power consumption associated with pre-charging and discharging the match lines of a CAM array during successive compare operations.

BRIEF DESCRIPTION OF THE DRAWINGS

Present embodiments are illustrated by way of example, and not by way of limitation, in the figures of the accompanying drawings and in which like reference numerals refer to similar elements and in which.

DETAILED DESCRIPTION

Figure 1:
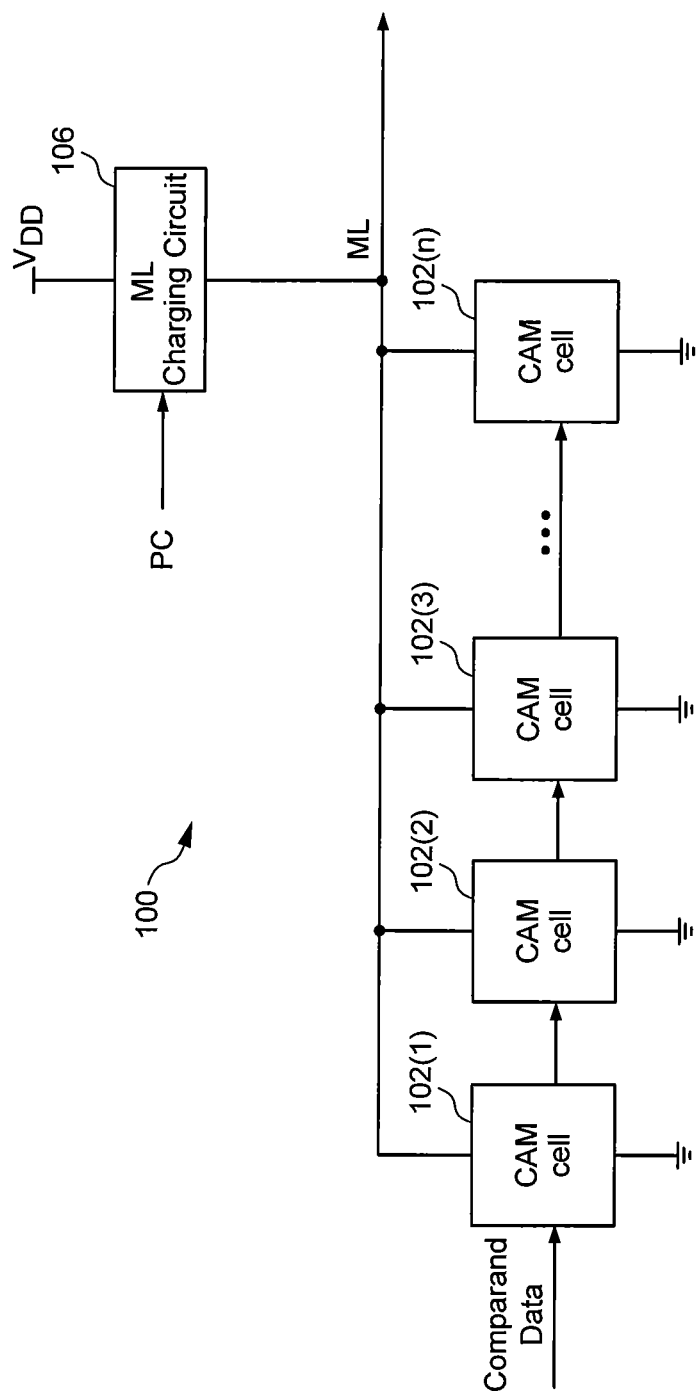
FIG. 1 is a block diagram of a conventional content addressable memory (CAM) row with a controllable match line charging circuit.

A method and apparatus for reducing power consumption in a CAM device are discussed below. In the following description, for purposes of explanation, specific nomenclature is set forth to provide a thorough understanding of the present embodiments. However, it will be apparent to one skilled in the art that these specific details may not be required to practice the present embodiments. It is to be understood that the present embodiments are equally applicable to CAM structures of other sizes and configurations, as well as to other types of memory devices such as, for instance, RAM, Flash, and EEPROM. In other instances, well-known circuits and devices are shown in block diagram form to avoid obscuring the present embodiments unnecessarily. Additionally, the interconnection between circuit elements or blocks may be shown as buses or as single signal lines. Each of the buses may alternatively be a single signal line, and each of the single signal lines may alternatively be a bus. Further, the logic levels assigned to various signals in the description below are arbitrary, and therefore may be modified (e.g., reversed polarity) as desired. Accordingly, the present embodiments are not to be construed as limited to specific examples described herein but rather include within their scope all embodiments defined by the appended claims.

A content addressable memory (CAM) device is disclosed that includes CAM rows that are partitioned into row segments that are selectively enabled in response to match results in previous CAM row segments, thereby reducing power consumption during compare operations in which less than all of the row segments are enabled. Further, in accordance with present embodiments, the selective enabling of subsequent row segments in response to match results in previous row segments is performed using self-timed control signals that are generated by a reference row of CAM cells, thereby alleviating the need for precise timing synchronization between various match latch signals and match line pre-charge signals.

More specifically, the CAM cells in each row segment are coupled to a corresponding match line segment that is selectively discharged in response to a logical combination of match results of the previous CAM row segment and an associated self-timed control signal generated by a corresponding segment of the reference row. For some embodiments, the reference row of CAM cells is similar to each regular row of CAM cells so that operating characteristics (e.g., signal propagation delays and compare times) of the reference row are the same (e.g., to within manufacturing tolerances) as those of the regular rows. In this manner, simple combinational logic can be used to selectively enable subsequent CAM row segments in response to match results in previous CAM row segments without employing complex match line control circuits and without relying upon precise timing synchronization between match latch signals and match line pre-charge signals.

FIG. 1 shows a CAM row 100 as having n CAM cells 102(1)-102(n) each coupled to an associated match line ML. Each CAM cell 102 is coupled between a match line ML and ground potential. Although not shown for simplicity, each CAM cell 102 includes at least one storage element to store one or more data bits and includes at least one compare circuit that compares a bit of a search key (e.g., a comparand word) with data stored in the storage element. The storage element can be implemented using Static Random Access Memory (SRAM), Dynamic RAM (DRAM), a non-volatile memory cell (e.g., EEPROM or flash memory cell), or any other suitable memory element. For simplicity, word lines, bit lines, comparand lines, and other well-known elements of the associated CAM array are not shown in FIG. 1. In addition, various well-known clock, enable, and control signals are not shown in FIG. 1 for simplicity.

A match line charging circuit 106 is coupled between a supply voltage VDD and match line ML, and includes an input to receive a pre-charge signal (PC). Prior to each compare operation between an n-bit comparand word and an n-bit CAM word stored in CAM cells 102(1)-102(n), match line ML is pre-charged to or toward a supply voltage VDD via ML charging circuit 106 in response to PC. The n-bits of the comparand word are compared with corresponding bits of the CAM word in respective CAM cells 102(1)-102(n). If all bits of the comparand word match corresponding bits of the CAM word, then the match line ML remains in its charged state to indicate a match condition. Conversely, if any one of the comparand bits does not match the corresponding CAM bit, then the CAM cell 102 storing that CAM bit discharges match line ML low toward ground potential to indicate a mismatch condition.

As described above, the match lines in a CAM array are typically pre-charged high toward the supply voltage VDD for each and every compare operation. Thus, for each row having a mismatch condition, an associated match line ML is first charged high toward VDD and then discharged toward low ground potential. Current flow associated with this charging and discharging of such match lines results in undesirable power consumption. Further, as the number of CAM cells in each row of a CAM array increases, capacitive loading on the match lines increases, which in turn further increases power consumption.

A CAM array can be partitioned into a number of row segments to reduce power consumption, for example, as described in commonly-owned U.S. Pat. No. 6,243,280, the entirety of which is incorporated by reference herein. As disclosed in U.S. Pat. No. 6,243,280, rows of the CAM array are partitioned into a plurality of row segments, with each row segment having a corresponding match line segment. Typically, a first match line segment is pre-charged to enable detection of match conditions in the associated first row segment, and then subsequent match line segments are selectively pre-charged in response to match results in the preceding row segments. Thus, if the first row segment does not have a match condition, then the match line segments in subsequent row segments are not pre-charged, thereby reducing power consumption during compare operations.

Figure 2:
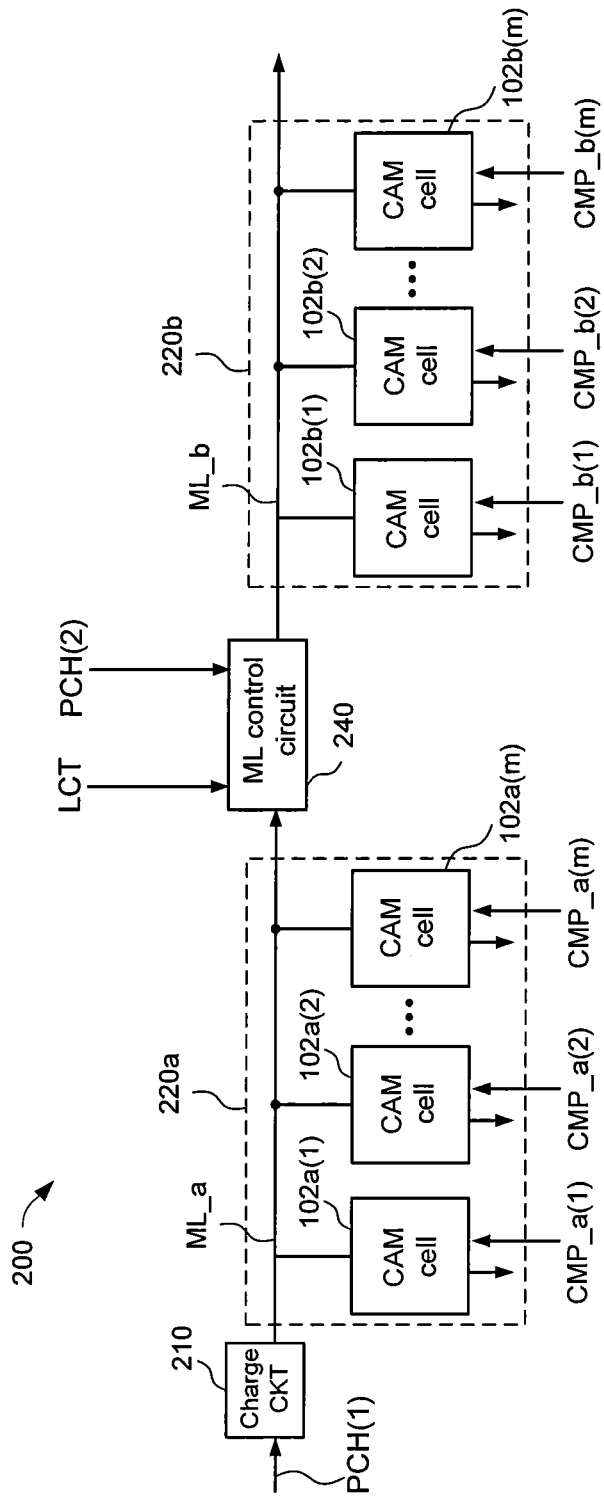
FIG. 2 is a block diagram of a conventional partitioned CAM row.

For example, FIG. 2 is a block diagram of a CAM row 200 of the type disclosed in U.S. Pat. No. 6,243,280. In FIG. 2, a 2×m-bit CAM row 200 is partitioned into a first row segment 220a and a second row segment 220b, with each row segment having m CAM cells. CAM cells 102a(1)-102a(m) in first row segment 220a are each coupled to associated first match line segment ML_a and each receive one bit of comparand data CMP_a(1)-CMP_a(m). Similarly, CAM cells 102b(1)-102b(m) in second row segment 220b are each coupled to associated second match line segment ML_b and each receive one bit of comparand data CMP_b(1)-CMP_b(m), respectively. Pre-charge operations for the first row segment 220a are controlled by a charge circuit 210 in response to a first pre-charge signal PCH(1), and pre-charge operations for the second row segment 220b are controlled by a match line control circuit 240 in response to a timing signal LCT and a second pre-charge signal PCH(2). More specifically, although not shown in FIG. 2 for simplicity, match line control circuit 240 typically includes a latch element that is clocked by the timing signal LCT, and includes a pre-charge circuit that is controlled by the second pre-charge signal PCH(2).

During compare operations, charge circuit 210 pre-charges the first match line segment ML_a upon assertion of a first pre-charge signal PCH(1), thereby enabling detection of match conditions within the first row segment 220a. The resulting match condition reflected on the first match line segment ML_a is latched into the match line control circuit 240 upon assertion of the timing signal LCT.

If there is a match condition in first row segment 220a, match line control circuit 240 pre-charges the second match line segment ML_b upon assertion of the second pre-charge signal PCH(2), thereby enabling detection of match conditions within the second row segment 220b. Conversely, if there is a mismatch condition in the first row segment 220a, the resulting logic low state of ML_a causes the match line control circuit 240 to not pre-charge the second match line segment ML_b, thereby disabling the second row segment 220b and reducing power consumption associated with charging and discharging the second match line segment ML_b.

Although effective in reducing power consumption, segmenting CAM rows in the manner disclosed in U.S. Pat. No. 6,243,280 involves inserting clocked match line control circuits 240 between each pair of adjacent row segments, which not only increases circuit complexity but also reduces search speeds because of latencies associated with the clocked match line control circuits 240. Perhaps more importantly, match line control circuits 240 rely upon precise timing synchronizations not only between corresponding LCT signals but also between the LCT and PCH signals, which present challenges.

Figure 3:
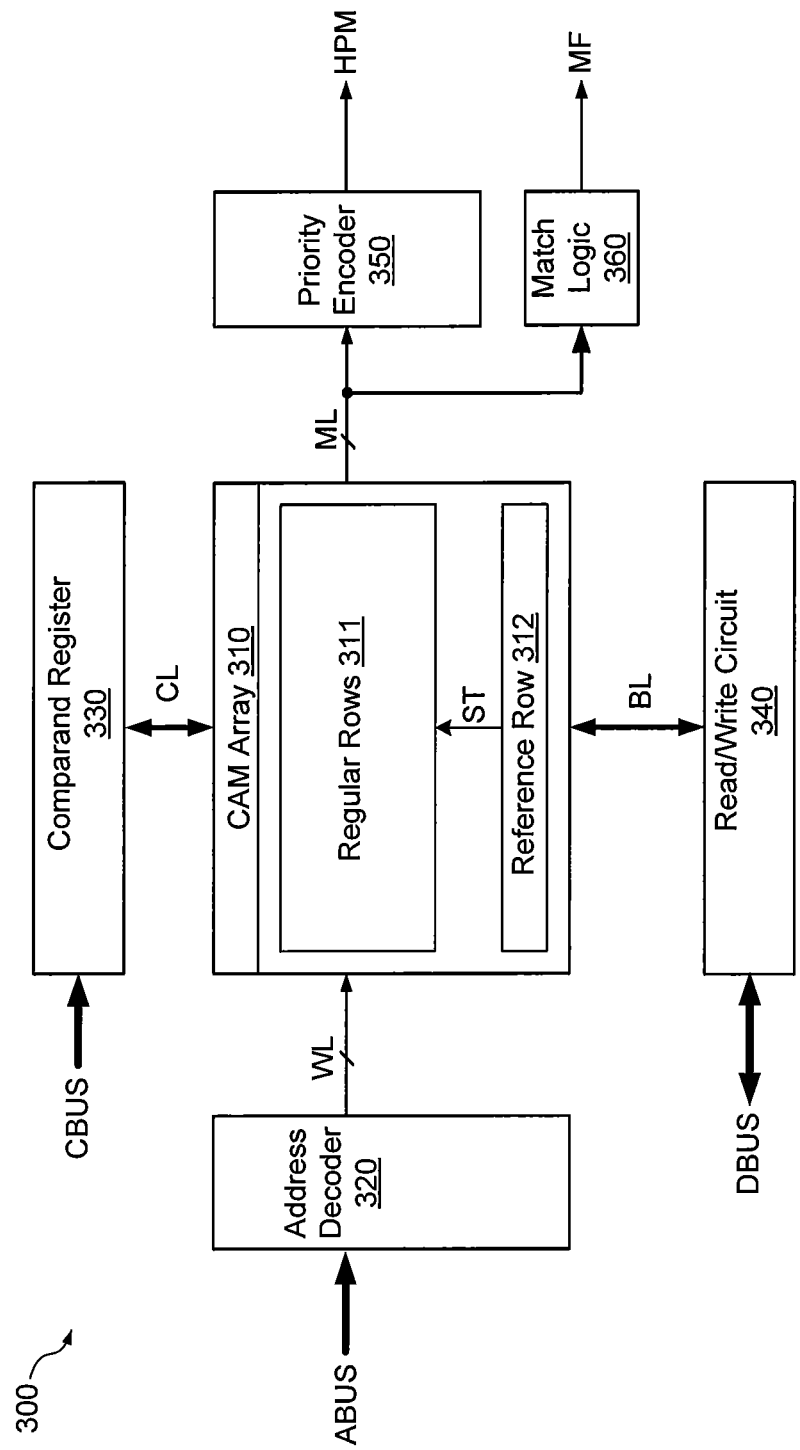
FIG. 3 is a block diagram of a CAM device within which the present embodiments may be implemented.

FIG. 3 is a block diagram of a CAM device 300 within which the present embodiments may be implemented. CAM device 300 includes a CAM array 310, an address decoder 320, a comparand register 330, a read/write circuit 340, a priority encoder circuit 350, and match logic 360. CAM array 310 includes any number of rows of CAM cells (not shown for simplicity in FIG. 3), where each row of CAM cells can be configured to store a data word. More specifically, CAM array 310 includes a plurality of regular rows 311 of CAM cells, and includes a reference row 312 of CAM cells that provide self-timed (ST) control signals to the plurality of regular CAM rows 311. As described in more detail below, the plurality of regular CAM rows 311 are divided into a number of cascaded regular row segments, the reference CAM row 312 is divided into a number of cascaded reference row segments, and each reference row segment provides an associated ST signal to corresponding regular CAM row segments to control the selective enabling of subsequent regular row segments in response to match results in previous regular row segments. Further, while CAM array 310 is shown in FIG. 3 as a single CAM array, it may include any number of CAM array blocks that can be independently searched.

One or more instructions and related control signals may be provided to CAM device 300 from an instruction decoder (not shown for simplicity) to control read, write, compare, and other operations for CAM device 300. Other well-known signals that can be provided to CAM device 300, such as enable signals, clock signals, and power connections, are not shown for simplicity. Further, although not shown in FIG. 3, each row of CAM cells in CAM array 310 may have one or more validity bits to indicate whether the corresponding row (or any segment thereof) of CAM cells stores valid data.

Each row of CAM cells (not shown in FIG. 3 for simplicity) in CAM array 310 is coupled to address decoder 320 via a corresponding word line WL, and to priority encoder 350 and well-known match logic 360 via a corresponding match line ML. For simplicity, the word lines and match lines are represented collectively in FIG. 3. Address decoder 320 is well-known, and includes circuitry to select corresponding rows in CAM array 310 for read, write, and/or other operations in response to an address received from an address bus (ABUS) using the word lines WL. For other embodiments, addresses may be provided to address decoder 320 from another suitable bus and/or circuitry.

The match lines ML provide match results for compare operations between comparand data (e.g., a search key) and data stored in CAM array 310. Priority encoder 350, which is well-known, uses the match results indicated on the match lines to determine the matching entry that has the highest priority number associated with it and generates the index or address of this highest priority match (HPM). In addition, priority encoder 350 may use the validity bits from CAM array 310 to generate the next free address that is available in CAM array 310 for storing new data. Although not shown in FIG. 3, for some embodiments, priority encoder 350 may provide the next free address to the address decoder 320.

Match logic 360, which is well-known, uses the match results indicated on the match lines to generate a match flag (MF) indicative of a match condition in CAM array 310. If there is more than one matching entry in CAM array 310, match logic 360 may generate a multiple match flag to indicate a multiple match condition. In addition, match logic 360 may use the validity bits from CAM array 310 to assert a full flag when all of the rows of CAM cells in CAM array 310 are filled with valid entries.

Each column of CAM cells (not shown in FIG. 3 for simplicity) in CAM array 310 is coupled to comparand register 330 via one or more corresponding comparand lines CL, and is coupled to read/write circuit 340 via one or more corresponding bit lines BL. For simplicity, the comparand lines CL and bit lines BL are represented collectively in FIG. 3. Comparand register 330 is well-known, and is configured to provide a search key (e.g., a comparand word) received from a comparand bus (CBUS) to CAM array 310 during compare operations with data stored therein. For other embodiments, the search key can be provided to CAM array 310 via another bus and/or circuit. Read/write circuit 340 includes well-known write drivers to write data received from a data bus (DBUS) to CAM array 310 via the bit lines BL, and includes well-known sense amplifiers to read data from CAM array 310 onto DBUS. For other embodiments, read/write circuit 340 may be coupled to a bus other than DBUS. Further, although not shown in FIG. 3 for simplicity, CAM device 300 can include a well-known global mask circuit (e.g., coupled to the comparand register 330) that can selectively mask the bits of the search key provided to the CAM array 310.

Figure 4:
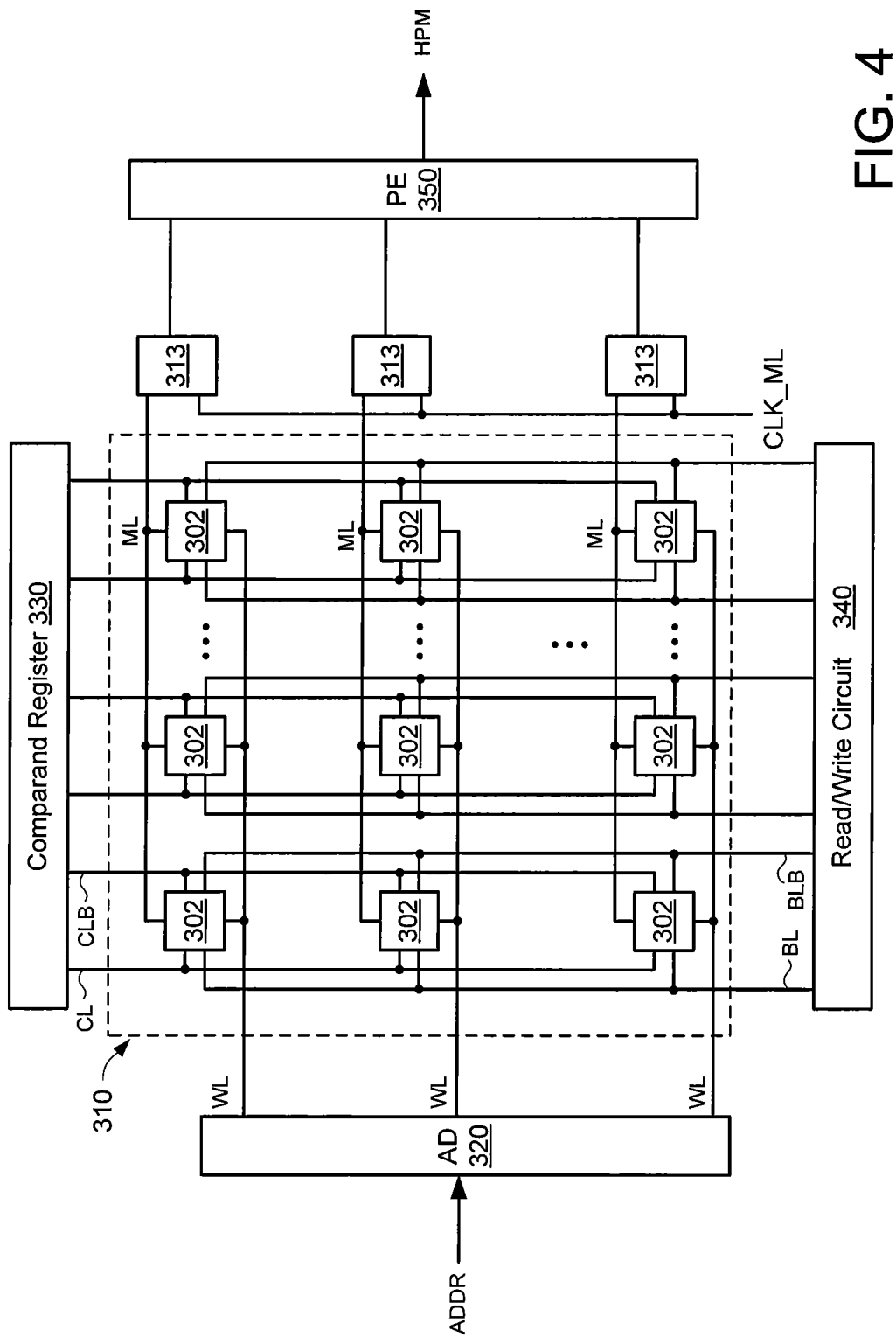
FIG. 4 is a block diagram of one embodiment of the CAM array of FIG. 3.

FIG. 4 is a more detailed block diagram of the CAM array 310 of FIG. 3. CAM array 310 is shown to include a plurality of CAM cells 302 organized in any number of rows and columns. The rows of CAM cells 302 in FIG. 4 correspond to the regular rows 311 of FIG. 3, and for simplicity, the reference row 312 of FIG. 3 is not shown in FIG. 4. The CAM cells 302 can be any suitable type of CAM cell including, for example, binary CAM cells, ternary CAM cells, and/or quaternary CAM cells. As noted above, each row of CAM array 310 may also include one or more validity bits. Each row of CAM cells 302 is coupled to a match line ML and to a word line WL. Each word line WL is driven by address decoder 320 (see also FIG. 3) to select one or more rows of CAM cells 302 for writing or reading. Each match line ML is coupled to priority encoder 350 via a corresponding match latch 313. The match latches 313 are clocked by a match latch clock signal CLK_ML in a well-known manner. Each column of CAM cells 302 in CAM array 310 is coupled to read/write circuit 340 via a complementary bit line pair BL/BLB, and to comparand register 330 via a complementary comparand line pair CL/CLB.

Prior to compare operations, the match lines are precharged (e.g., to logic high), and each set of complementary comparand line pairs CL/CLB are driven to the same predetermined logic level (e.g., to logic low). Then, during compare operations, the comparand register 330 provides the search key (i.e., the comparand word) to the CAM cells 302 by driving each pair of complementary comparand lines CL/CLB to opposite logic states indicative of the corresponding bit of the search key. For example, to provide a logic low comparand bit (C) to a column of CAM cells, the corresponding comparand line CL is driven to a first logic state (e.g., logic low) and the corresponding complementary comparand line CLB is driven to a second logic state (e.g., logic high); conversely, to provide a logic high comparand bit C to the column of CAM cells, the corresponding comparand line CL is driven to the second logic state (e.g., logic high) and the corresponding complementary comparand line CLB is driven to the first logic state (e.g., logic low). Thereafter, if all the CAM cells 302 in a particular row match the corresponding bits of the search key, then the match line ML remains in its logic high state to indicate the match condition. Conversely, if one or more of the CAM cells 302 in the row do not match the corresponding bit of the search key, then mismatching CAM cells 302 discharge the match line (e.g., to or toward ground potential) to indicate the mismatch condition.

Figure 5:
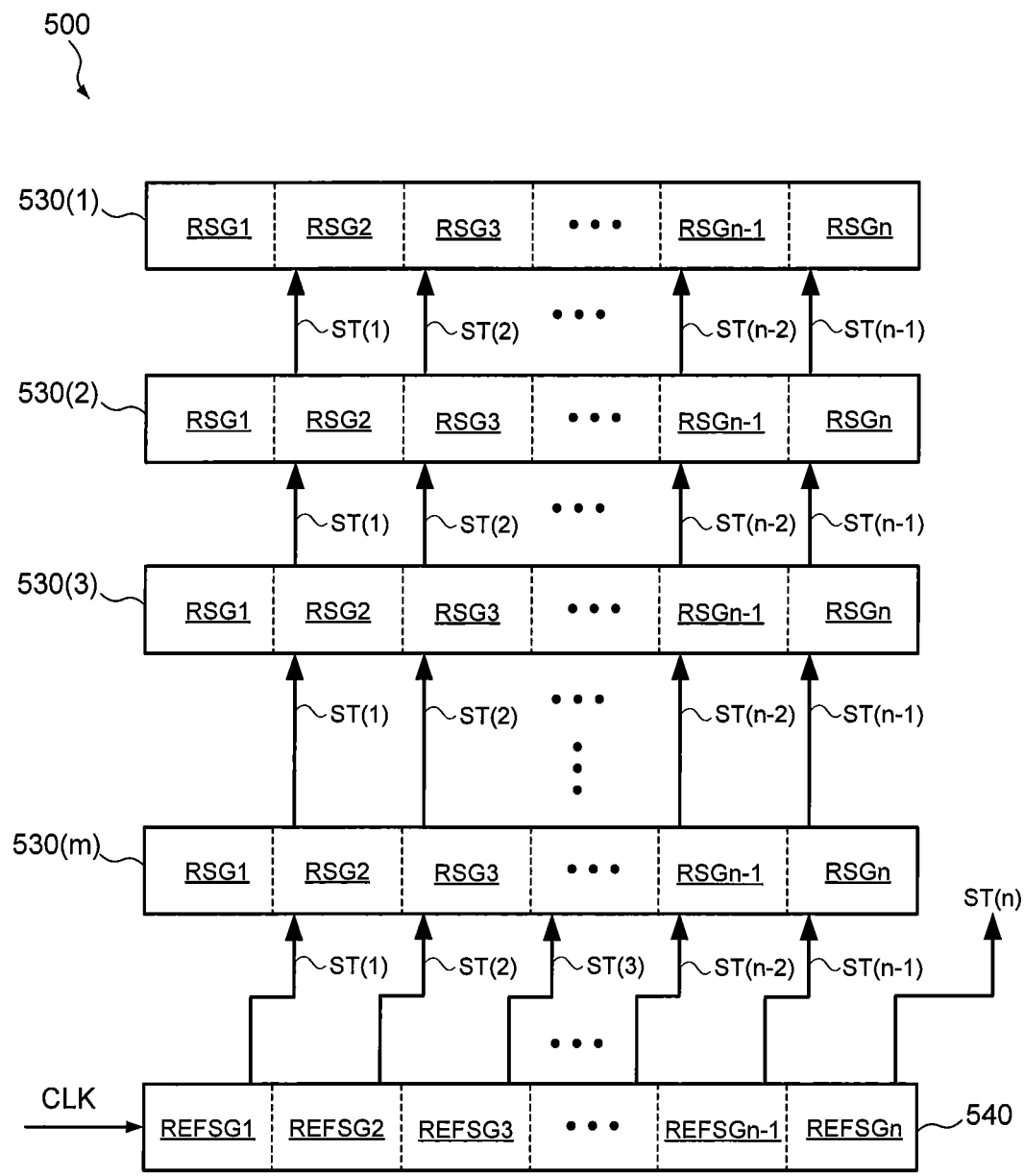
FIG. 5 is a block diagram of a CAM array having a number of segmented CAM rows and a segmented reference row in accordance with the present embodiments.

FIG. 5 is a block diagram of a CAM array 500 that is one embodiment of CAM array 310 of FIG. 3. In accordance with the present embodiments, CAM array 500 is shown to include a plurality of regular CAM rows 530(1)-530(m) and include a reference CAM row 540. The numbers of regular CAM rows 530 and reference CAM rows 540 in CAM array 500 are arbitrary. Each regular CAM row 530 and reference CAM row 540 can include any suitable type of CAM cells, including binary, ternary, and/or quaternary CAM cells. However, for purposes of discussion herein, CAM rows 530 and 540 include well-known quaternary CAM cells.

Each regular CAM row 530 is partitioned into a plurality of regular row segments RSG1-RSGn, and the reference CAM row 540 is partitioned into a plurality of reference row segments REFSG1-REFSGn. Although in some embodiments corresponding segments of different CAM rows 530 include the same number of CAM cells, the segments within each regular CAM row 530 can include different numbers of CAM cells. For example, the first segments RSG1 of regular CAM rows 530(1)-530(m) can each include a first number N1 of CAM cells, the second segments RSG2 of regular CAM rows 530(1)-530(m) can each include a second number N2 of CAM cells, and so on, where the $n^{th}$ segments RSGn of regular CAM rows 530(1)-530(m) can each include a $n^{th}$ number Nn of CAM cells, where the numbers N1 to Nn can be any integers. For one exemplary embodiment, the first row segments RSG1 can have a significantly fewer number of CAM cells than subsequent row segments to minimize power consumption in the first row segments (e.g., because subsequent row segments typically do not discharge if corresponding previous row segments mismatch, the more previous row segments that mismatch, the more subsequent row segments will not discharge). For one example, the first row segments RSG1 can have less than a dozen CAM cells, and the subsequent row segments can each have dozens of CAM cells. The specific number of CAM cells in each row segment can vary depending upon the fabrication process technology, the likelihood of earlier row segments discharging to indicate a mismatch condition, and/or other factors.

For some embodiments, the reference CAM row 540 is architecturally similar to the regular CAM rows 530 to ensure proper timing for the array. Thus, for example, reference CAM row 540 is divided into the same number of segments as regular CAM rows 530, and each segment of the reference CAM row 540 can include approximately the same number of similar CAM cells as corresponding segments of the regular CAM rows 530. Thus, for some embodiments, each segment of the reference CAM row 540 includes the same number of CAM cells as corresponding segments of the regular CAM rows 530. For example, if the first regular CAM row segments RSG1 each include 32 CAM cells, then the first reference CAM row segment REFSG1 can include 32 identical CAM cells. However, for other embodiments, each segment of the reference CAM row 540 can include more CAM cells than corresponding segments of the regular CAM rows 530 so that each segment of the reference row 540 generates its associated self-timed control signal more slowly than corresponding segments of the regular CAM rows 530 generate match results. This ensures that the match results generated by segments of the regular CAM rows 530 are ready for evaluation upon assertion of associated self-timed signals by corresponding segments of the reference CAM row 540. For example, if the first regular CAM row segments RSG1 each include 32 CAM cells, then the first reference CAM row segment REFSG1 may include several more than 32 CAM cells to ensure that the first regular CAM row segments RSG1 evaluate match results prior to assertion of the first self-timed signal ST(1) by the first reference row segment REFSG1.

The reference CAM row 540 receives a clock signal CLK, and in response thereto, the segments REFSG1-REFSGn of the reference CAM row 540 can generate corresponding self-timed control signals ST(1)-ST(n) by comparing a predetermined reference search key with predetermined reference data stored therein at the same time that a search key is compared with data stored in the regular CAM rows 530. Comparing a predetermined reference search key with predetermined reference data in the reference row 540 ensures that the reference row 540 asserts the self-timed control signals in a predictable manner (e.g., in response to predetermined match conditions generated by the reference row 540). Thus, the predetermined reference data and the predetermined reference search key can be selected and/or adjusted to precisely control the timing of the self-timed control signals ST(1)-ST(n). For some embodiments, the predetermined reference data and the predetermined reference search key can be retrieved from a memory element (not shown for simplicity) such as a fuse bank or other non-volatile memory within or associated with the CAM array 500.

More specifically, each segment of the reference CAM row 540 generates an associated self-timed control signal (ST) that is provided as a timing signal to be combined with the match results in the corresponding segment in each of the regular CAM rows 530 to determine whether to enable corresponding subsequent segments in the regular CAM rows 530 for the compare operation. For example, the self-timed control signal ST(1) generated by the first reference CAM row segment REFSG1 is provided to the second row segments RSG2 of all the regular CAM rows 530, the self-timed control signal ST(2) generated by the second reference CAM row segment REFSG2 is provided to the third row segments RSG3 of all the regular CAM rows 530, and so on. For some embodiments, the self-timed control signal ST(n) generated by the $n^{th}$ reference CAM row segment REFSGn can be provided as a clock signal to match latches (not shown in FIG. 5 for simplicity) associated with the regular CAM rows 530(1)-530(m). Thus, as described in more detail below, the first row segment RSG1 in each regular CAM row 530 is enabled in response to a corresponding pre-charge signal (not shown for simplicity), and the subsequent CAM row segments RSG2-RSGn in regular CAM rows 530 are each selectively enabled for compare operations in response to a logical combination of match results in the previous regular CAM row segment and the corresponding self-timed control signal ST. For example, the second row segment RSG2 of regular CAM row 530(1) is selectively enabled in response to match results in the first row segment RSG1 of regular CAM row 530(1) and the corresponding self-timed control signal ST1, the third row segment RSG3 of regular CAM row 530(1) is selectively enabled in response to match results in the second row segment RSG2 of regular CAM row 530(1) and the corresponding self-timed control signal ST2, and so on.

Figure 6A:
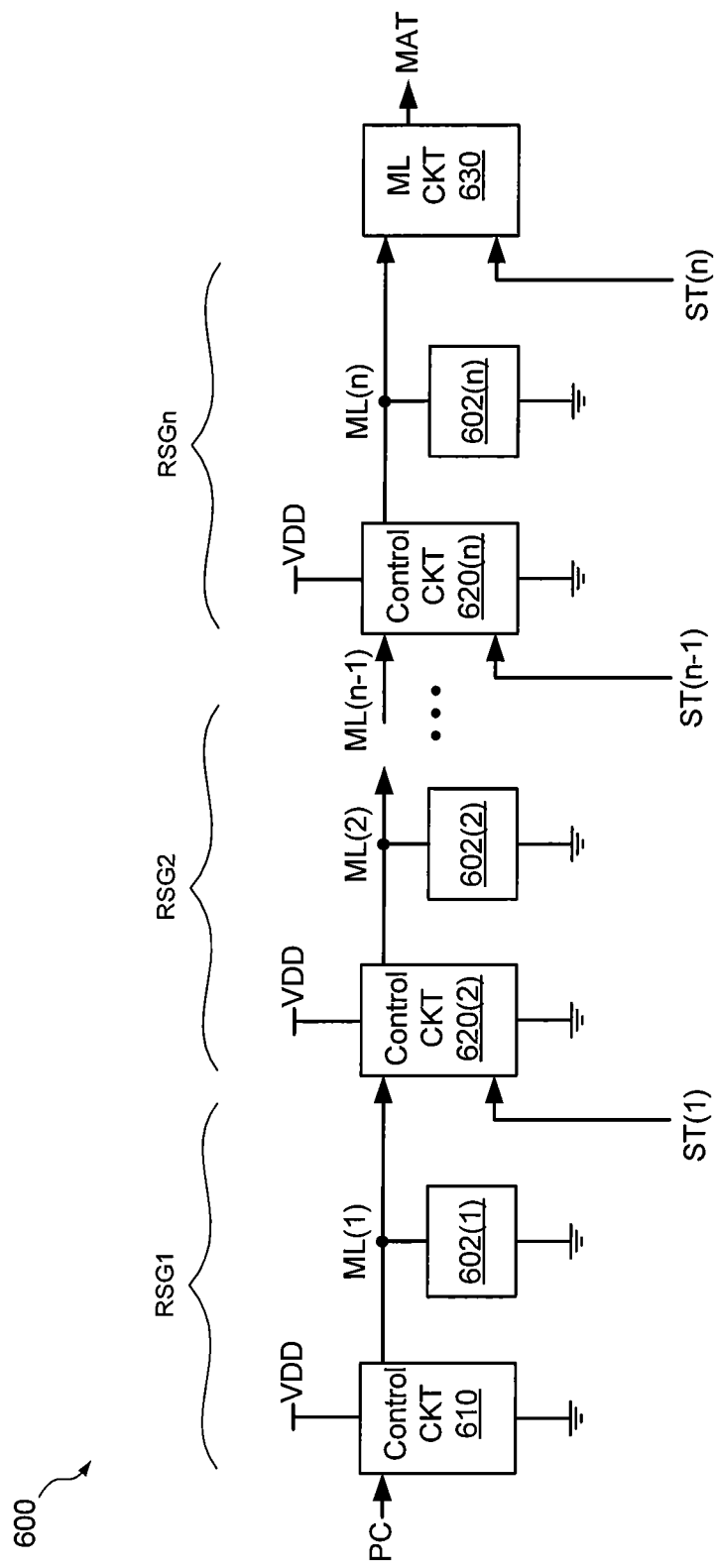
FIG. 6A is a simplified functional block diagram of an exemplary embodiment of the regular CAM row of FIG. 5.

FIG. 6A is functional block diagram of a CAM row 600 that is an exemplary embodiment of a regular CAM row 530 of FIG. 5. The CAM row 600 includes a plurality of row segments RSG1-RSGn, with each row segment having any number of CAM cells 602 (shown collectively in FIG. 6A) coupled to a corresponding match line segment ML. The match line segment of the first row segment RSG1 is coupled to a match line control circuit 610, and the match line segment ML in each subsequent row segment is coupled to a corresponding match line control circuit 620. CAM cells 602 in each row segment can be any suitable type of CAM cells, including, for example, binary CAM cells, ternary CAM cells, or quaternary CAM cells.

During compare operations, the CAM cells 602 in each row segment receive a corresponding portion of the search key in a well-known manner. The control circuit 610 pre-charges the first match line segment ML(1) in response to a pre-charge signal PC, control circuit 620(2) selectively enables the second row segment RSG2 to evaluate match results in response to a logical combination of match results in the first row segment RSG1 and the first self-timed control signal ST1, and so on, where control circuit 620(n) selectively enables the $n^{th}$ row segment RSGn to evaluate match results in response to a logical combination of match results in the n-$1^{th}$ row segment RSGn-1 and the n-$1^{th}$ self-timed control signal ST(n-1). The last self-timed control signal ST(n) can be used as a clock signal for match latch circuit 630.

The control circuit 610 can be any suitable circuit that pre-charges ML(1) high towards VDD for compare operations. Each of control circuits 620 can be any suitable control circuit that selectively enables its corresponding row segment for compare operations in response to match conditions in the previous row segment and the corresponding ST signal. For some embodiments, each control circuit 620 selectively pre-charges its corresponding match line segment upon assertion of the corresponding ST signal only if there is a match condition in the previous row segment, and otherwise does not pre-charge the match line segment. For other embodiments, the match line segments ML(1)-ML(n) are all pre-charged high (e.g., toward VDD), and each control circuit 620 selectively allows its corresponding match line segment to be discharged (e.g., to indicate a mismatch condition) upon assertion of the corresponding ST signal only if there is a match condition in the previous row segment, and otherwise does not allow the match line segment to be discharged.

Figure 6B:
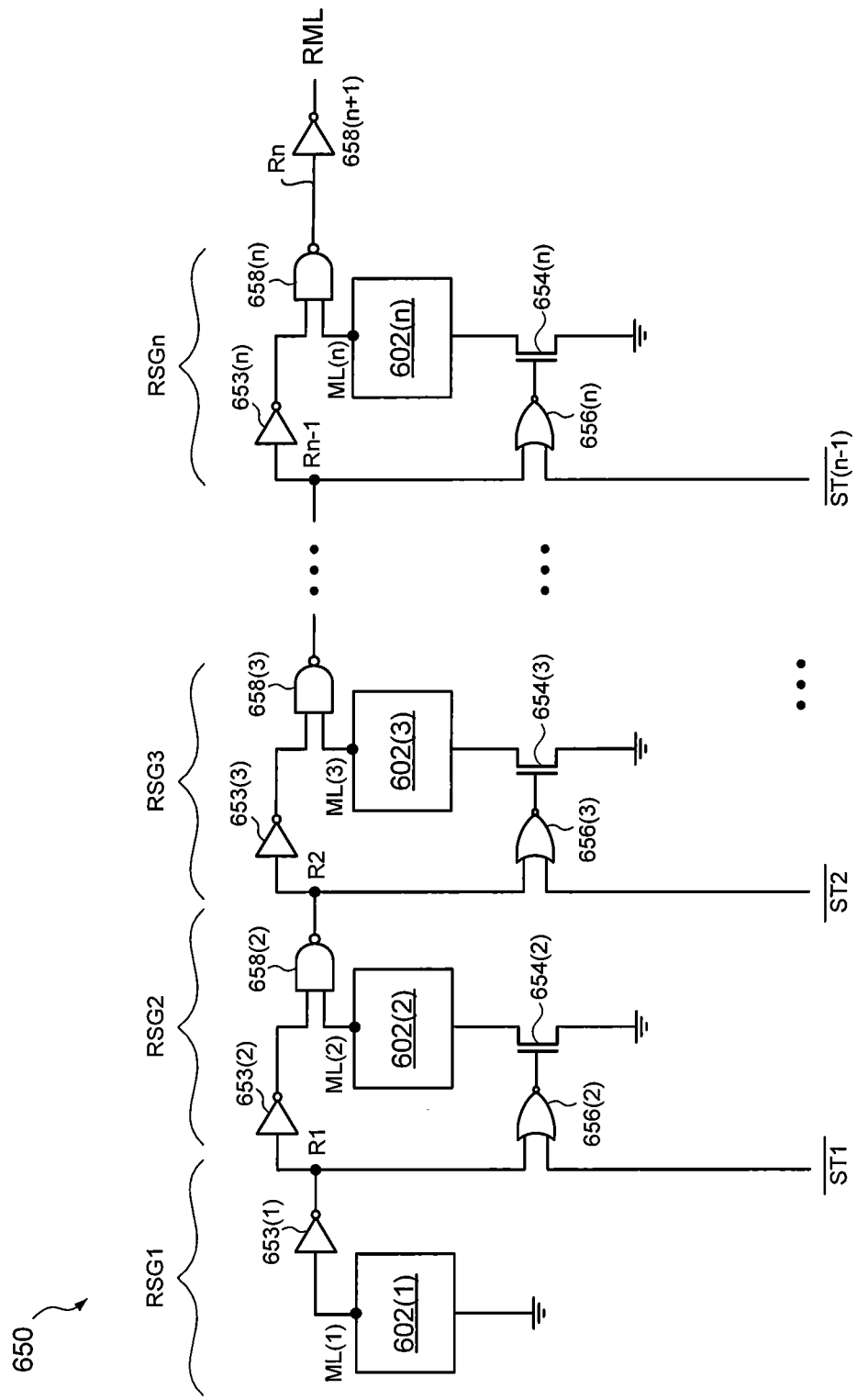
FIG. 6B is a more detailed block diagram of the regular CAM row of FIG. 5 in accordance with some embodiments.

FIG. 6B is a CAM row 650 that is one embodiment of a regular CAM row 530 of FIG. 5. The CAM row 650 includes a plurality of row segments RSG1-RSGn, with each row segment having any number of CAM cells 602 (shown collectively in FIG. 6B). The CAM cells 602 in each row segment are coupled to an associated match line segment ML, and receive a corresponding portion of the search key in a well-known manner during compare operations. CAM cells 602 in each row segment can be any suitable type of CAM cells, including, for example, binary CAM cells, ternary CAM cells, or quaternary CAM cells.

During a pre-charge phase of the compare operation, match line segments ML(1)-ML(n) are pre-charged to logic high (e.g., to or toward VDD) by well-known pre-charge circuits (not shown for simplicity) to enable detection of match conditions within corresponding row segments RSG1-RSGn. For example, the first match line segment ML(1) of the first row segment RSG1 is pre-charged to logic high (e.g., to or toward VDD) to enable detection of match conditions within the associated CAM cells 602(1) of the first row segment RSG1. Then, during compare operations, if a match is detected in the first row segment RSG1, the first match line segment ML(1) remains in its logic high state. Conversely, if a mismatch is detected in the first row segment RSG1, the first match line segment ML(1) is discharged to logic low (e.g., ground potential).

The logic state of first match line segment ML(1) propagates to a first result node R1 via a well-known logical inverter 653(1), and selectively enables the second row segment RSG2 to participate in the compare operation. More specifically, if the first match line segment ML(1) indicates a match condition in the first row segment RSG1, then the second row segment RSG2 is enabled to selectively discharge its corresponding match line segment ML(2) in response to a mismatch condition within second row segment 602(2). Conversely, if the first match line segment ML(1) indicates a mismatch condition in the first row segment RSG1, then the second row segment RSG1 is prevented from discharging its corresponding match line segment ML(2), which remains in its logic high pre-charged state irrespective of match conditions within the second row segment RSG2.

A row match line (RML) indicates the match results for the entire CAM row 650. For example, if all of the match line segments ML(1)-ML(n) have a match condition, the row match line RML remains in its logic high state to indicate a match condition for the CAM row 650. Otherwise, if any of the match line segments ML(1)-ML(n) has a mismatch condition, the row match line RML is driven to logic low to indicate a mismatch condition for the CAM row 650. Thus, if a mismatch condition is detected in a given row segment, then all subsequent row segments are disabled by preventing their corresponding match line segments from being discharging. In this manner, power consumption is reduced by not discharging and then pre-charging the match line segments in the disabled row segments. Further, in contrast to prior techniques, such as that disclosed in U.S. Pat. No. 6,243,280, CAM row 650 does not have a separate clocked match line control circuit for each row segment, thereby reducing latency and pipelining logic throughout the CAM array.

More specifically, in accordance with the present embodiments, the first row segment includes an inverter 653(1) coupled between match line segment ML(1) and result node R1, and each subsequent row segment RSG includes a control circuit that includes a logical inverter 653, an enable/disable pull-down transistor 654, a NOR gate 656, and a NAND gate 658. For example, the second CAM row segment RSG2 includes a pull-down transistor 654(2) connected between ground potential and the CAM cells 602(2) of the second row segment and having a gate coupled to the output of NOR gate 656(2). NOR gate 656(2) has a first input to receive the match results from the first row segment RSG1 via result node R1, and has a second input to receive the logical complement of the first self-timed control signal $\overline{ST1}$ (i.e., where $\overline{ST1}$ is asserted to a logic low state and is de-asserted to a logic high state). The pull-down transistor 654(2) is configured to turn on and allow the CAM cells 602(2) in the second row segment RSG2 to discharge corresponding match line segment ML(2) only if there is a match condition in first row segment RSG1 (as indicated by ML(1) being in a logic high state and result node R1 being in a logic low state) and the associated control signal $\overline{ST1}$ is asserted to a logic low state. Otherwise, pull-down transistor 654(2) remains in a non-conductive state and prevents the CAM cells 602(2) in the second row segment RSG2 from discharging corresponding match line segment ML(2).

Thus, if a match condition is detected in the first row segment RSG1, the first match line segment ML(1) remains in its logic high state, which in turns drives the first result node R1 to logic low. Then, pull-down transistor 654(2) remains in the non-conductive state until the first self-timed control signal $\overline{ST1}$ is asserted to logic low, which causes NOR gate 656(2) to drive the gate of pull-down transistor 654(2) to logic high and thereby turn on the pull-down transistor 654(2). Once turned on, pull-down transistor 654(2) allows the CAM cells 602(2) in the second row segment RSG2 to discharge corresponding match line segment ML(2) if there is a mismatch condition in the second row segment. In this manner, a match condition in the first row segment RSG1 enables the second row segment RSG2 for the compare operation using the self-timed control signal $\overline{ST1}$. Because the self-timed control signal $\overline{ST1}$ is generated during the compare operation by a corresponding segment of the reference row 540 (see also FIG. 5) having CAM cells matched to the CAM cells 602(1) of the first row segment RSG1, assertion of the self-timed control signal $\overline{ST1}$ automatically coincides with the generation of match results in the first row segment RSG1. This is in contrast to prior match line cascading techniques that use complex match line control circuits and various clock and/or pre-charge signals.

Conversely, if a mismatch condition is detected in the first row segment RSG1, the first match line segment ML(1) is discharged to logic low, which in turns drives the first result node R1 to logic high. In response thereto, NOR gate 656(2) maintains the gate of pull-down transistor 654(2) in a logic low state, thereby maintaining the pull-down transistor 654(2) in a non-conductive state to prevent the second match line segment ML(2) from discharging, irrespective of match conditions in the second row segment RSG2. In this manner, the non-conductive pull-down transistor 654(2) disables the second row segment RSG2 from participating in the compare operation.

The match results generated for the second row segment RSG2 (e.g., as indicated on the corresponding second match line segment ML(2)) are logically combined with the match results generated for the first row segment RSG1 (e.g., as indicated on the corresponding first match line segment ML(1) and corresponding output of inverter 653(2)) in NAND gate 658(2) to produce cumulative match results for the first and second row segments at the second result node R2. The inverter 653(2) re-inverts the state of the match condition indicated on the previous result node R1.

The subsequent row segments are selectively disabled in response to match conditions in preceding row segments in a similar manner using corresponding self-timed control signals until either (1) all row segments RSG1-RSG$n$ indicate match conditions, in which case the row segment match conditions propagate through NAND gates 658(2)-658($n$) and drive the row match line RML to a logic high state to indicate a match condition for CAM row 650, or (2) a mismatch condition is detected in a given row segment, in which case subsequent match line segments ML are not discharged and the mismatch condition propagates through the corresponding NAND gates 658 and drives the row match line RML to a logic low state to indicate a mismatch condition for CAM row 650.

Power savings realized by present embodiments are proportional to the number of row segments in the CAM array, as well as to the percentage of mismatch conditions in the first row segments. If each CAM row is partitioned into N segments having equal numbers of CAM cells, power consumption resulting from the re-charging of match lines during compare operations may be potentially reduced by 100×(N−1)/N percent (e.g., if a mismatch condition is detected in a row segment). For example, if each CAM row is partitioned into two segments having equal numbers of CAM cells, power consumption resulting from not discharging and then re-charging the second match line segments during successive compare operations is reduced by approximately 50%. When employed in applications where compare operations typically result in mismatch conditions, present embodiments may achieve significant power savings because only one segment of the CAM row will be discharged and then pre-charged.

Figures 7A, 7B:
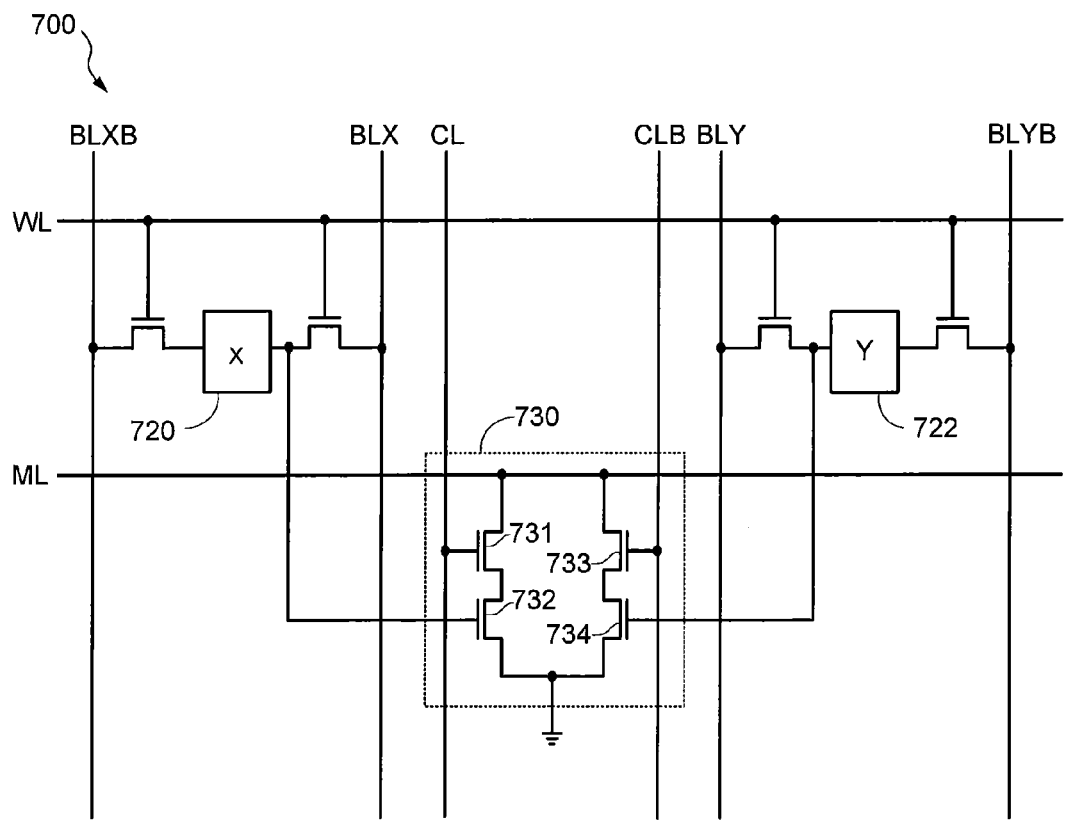
FIG. 7A is a circuit diagram of a conventional quaternary (XY) CAM cell.
FIG. 7B is a truth table illustrating operation of the XY CAM cell of FIG. 7A.

As mentioned above, detailed operation of the present embodiments is described for a CAM array have quaternary CAM cells. FIG. 7A shows a well-known quaternary CAM cell 700, which is also referred to as an XY CAM cell. The XY CAM cell 700 is shown to include two storage cells 720 and 722 coupled to a compare circuit 730. The two data bits X and Y can collectively represent four possible states: "0", "1", "don't care", and a fourth state which may be left unused or may indicate "invalid," as depicted in the truth table 750 of FIG. 7B. The logic "0" and "1" states correspond to the logic states represented, for example, by a conventional binary CAM cell. For each of these states, if the comparand data (e.g., provided to CAM cell 700 via complementary comparand lines CL and CLB) matches the data stored in CAM cell 700, compare circuit 730 does not discharge the match line ML, which indicates a match condition. Conversely, if the comparand data does not match the data stored in CAM cell 700, compare circuit 730 discharges ML (e.g., toward ground potential) to indicate the mismatch condition. For the "don't care" state, the logic low values for X and Y maintain respective transistors 732 and 734 in non-conductive states, thereby preventing compare circuit 730 from discharging ML. In this manner, data stored in CAM cell 700 is masked from the compare operation, thereby forcing a match condition for CAM cell 700, regardless of the comparand data. For the "invalid" state, the logic high values for X and Y maintain respective transistors 732 and 734 in conductive states. During a compare operation, one of the complementary comparand data bit pair provided on CL/CLB will be logic high, thereby causing compare circuit 730 to discharge ML to indicate the mismatch state. In this manner, data stored in CAM cell 700 forces a mismatch condition, regardless of the comparand data, and is therefore not normally used.

Figure 8:
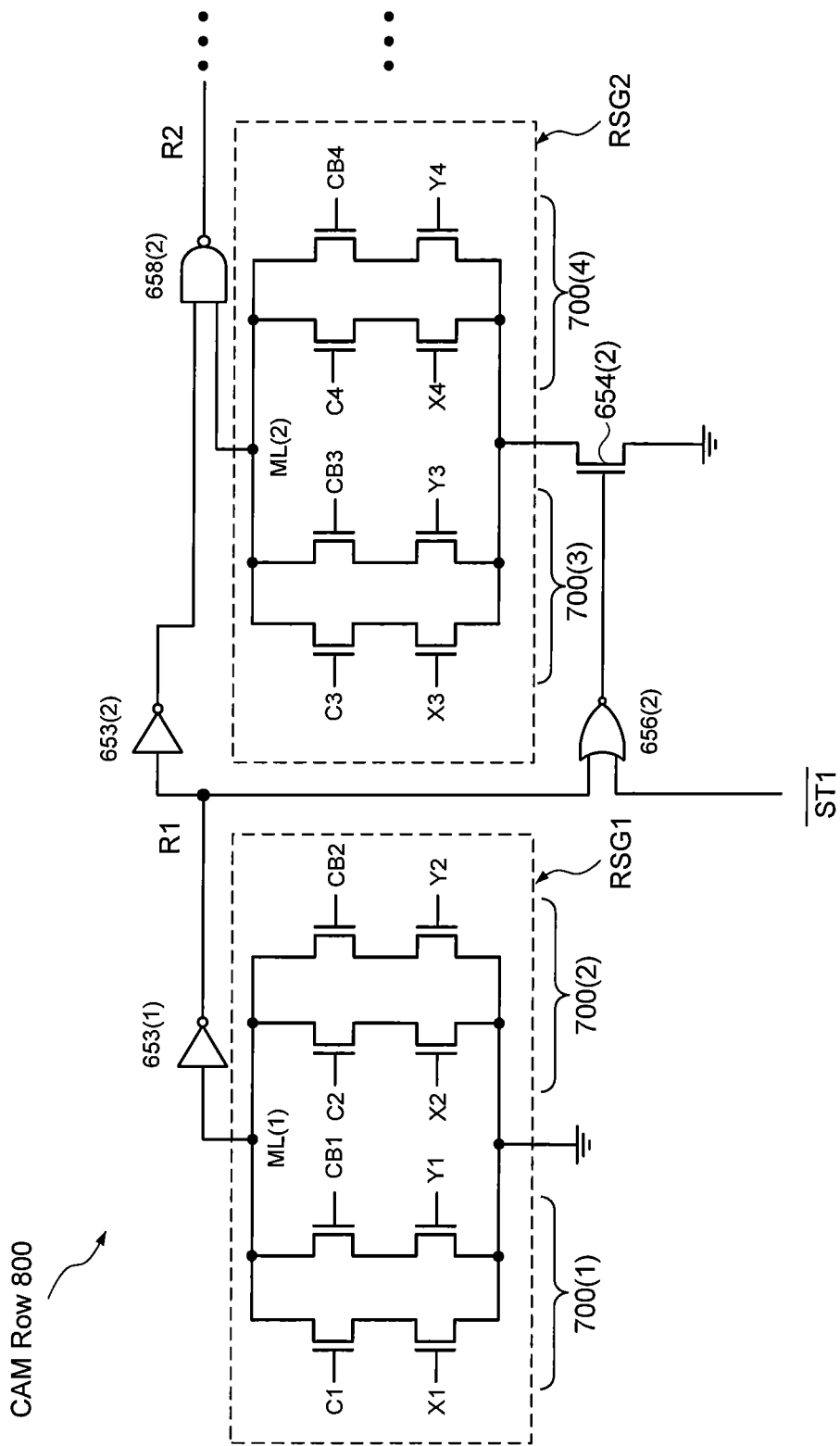
FIG. 8 is a block diagram of one embodiment of the CAM row of FIG. 6B.

FIG. 8 is a block diagram of a regular CAM row 800 that is one embodiment of the CAM row 650 of FIG. 6. CAM row 800 is shown to include 2 row segments RSG1 and RSG2, with each row segment having 2 quaternary CAM cells 700. For simplicity, only the compare circuits of the quaternary CAM cells 700 provided within CAM row 800 are shown in FIG. 8, with the quaternary CAM data bits X and Y and the complementary comparand bits C and CB shown as being provided to corresponding pull-down transistors in the compare circuit.

In operation, if both CAM cells 700(1) and 700(2) have match conditions (e.g., Y1=C1 and Y2=C2), the logic state of match line segment ML(1) remains in its logic high state, which in turn is provided as a logic low signal to first result node R1 by inverter 653(1). When $\overline{STI}$ is asserted to logic low by the reference CAM row (not shown in FIG. 8 for simplicity), NOR gate 656(2) drives its output high to turn on pull-down transistor 654(2), thereby enabling the second row segment RSG2 to participate in the compare operation. The logic low state at node R1 is inverted by inverter 653(2) and provided as a logic high signal to NAND gate 658(2), thereby allowing the output of NAND gate 658(2) to transition to logic low if there is also a match condition in the second row segment RSG2.

Conversely, if either of CAM cells 700(1) or 700(2) has a mismatch condition, the first match line segment ML(1) is discharged to logic low, which in turn is provided as a logic high signal to first result node R1 by inverter 653(1). The logic high state at node R1 forces the output of NOR gate 656(2) to logic low, thereby maintaining pull-down transistor 654(2) in a non-conductive state and disabling the second row segment RSG2 from participating in the compare operation. Subsequent row segments of CAM row 800 are disabled in a similar manner (e.g., by maintaining their corresponding pull-down transistors 654 in non-conductive states). The logic high state at node R1 is inverted by inverter 653(2) and provided as a logic low signal to NAND gate 658(2), thereby forcing the output of NAND gate 658(2) to logic high. The logic high output of NAND gate 658(2) propagates through the CAM row and, referring also to FIG. 6B, ultimately forces the row match line RML to a logic low state to indicate the mismatch condition.

Figure 9:
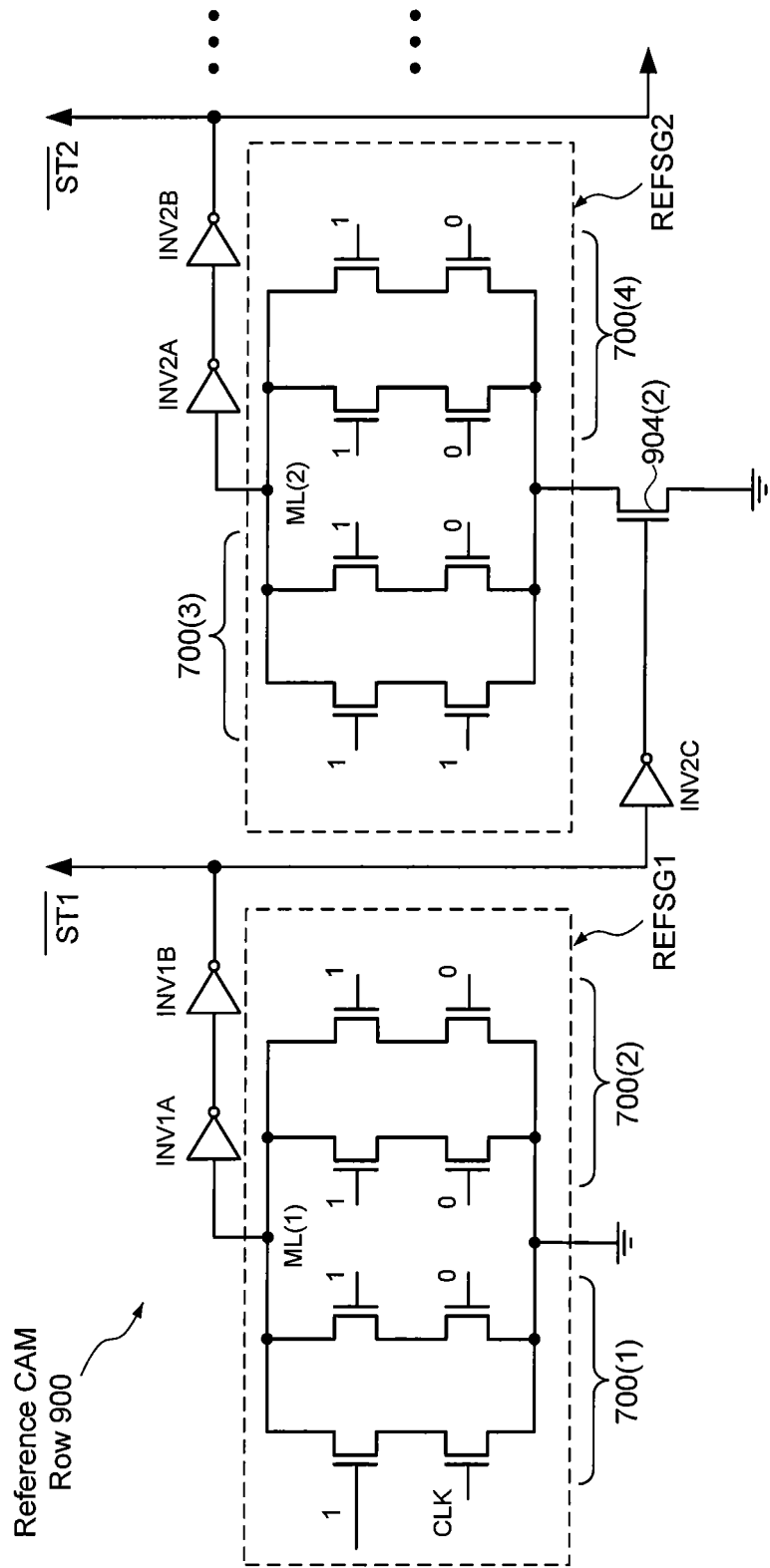
FIG. 9 is a block diagram of one embodiment of the self-timed clock row of FIG. 5.

FIG. 9 is a block diagram of a reference CAM row 900 that is one embodiment of the reference CAM row 540 of FIG. 5. The reference CAM row 900, which is structurally similar to regular CAM row 800, is shown to include 2 row segments REFSG1 and REFSG2, with each row segment having 2 quaternary CAM cells 700. For simplicity, only the compare circuits of the quaternary CAM cells 700 provided within reference CAM row 900 are shown in FIG. 9. More specifically, for the first CAM cell 700(1) in the first segment REFSG1 of the reference row 900, the clock signal CLK is provided as the X bit, the Y bit is set to logic 0, and the comparand bit C and complementary bit CB are set to logic 1. For the remaining CAM cell(s) 700(2) in the first segment REFSG1 of the reference CAM row 900, X=Y=0, and C=CB=1. For the first CAM cell 700(3) in the second segment REFSG2 of the reference row 900, X=1, Y=0, and C=CB=1. For the remaining CAM cell(s) 700(4) in the second segment REFSG2 of the reference CAM row 900, X=Y=0, and C=CB=1. In this manner, a single-bit mismatch condition is generated in each segment of the reference CAM row 900, thereby ensuring that assertion of the ST signals by reference CAM row 900 is slower than the generation of match results in corresponding segments of the regular CAM rows 800 of FIG. 8.

In operation, the reference CAM row 900 performs compare operations between the predetermined XY and reference comparand bits to generate the self-timed control signals $\overline{ST}$, which in turn are provided to regular CAM row 800 of FIG. 8 to control the propagation of match results between adjacent CAM row segments RSG. Thus, because the reference CAM row 900 employs similar CAM cells 700 as the regular CAM row 800, assertion of the self-timed control signals $\overline{ST}$ (e.g., to logic low) automatically occurs just after the generation of match results in corresponding segments RSG of the regular CAM row 800. Thus, for such embodiments, the match results generated in segments of regular CAM rows 800 have a set-up time prior to assertion of corresponding ST signals by the reference CAM row 900. Of course, for other embodiments, the reference CAM row 900 can employ different CAM cells than the regular CAM row 800 if the resulting sequential assertion of successive self-timed control signals $\overline{ST}$ occurs just after the generation of match results in corresponding successive segments of the regular CAM row 800.

More specifically, the first CAM cell 700(1) receives a clock input signal CLK from a system which incorporates a CAM array 500. The clock input signal CLK is connected to one of the four inputs of a compare circuit of CAM cell 700(1). The compare circuit of CAM cell 700(1) is configured in a way that the match line segment ML(1) is only discharged when the clock input signal CLK is asserted to logic high (e.g., at VDD); otherwise, when CLK is logic low, the match line segment ML(1) remains in its charged state. Therefore, CAM cell 700(1) is always operational and is switching between a match and a mismatch condition. Similarly, CAM cell 700(3) is configured to generate mismatch conditions, and thus its match line segment ML(2) is switching between charged and discharged states during successive compare operations. In this way, the clock input signal CLK is propagated through the circuitry to generate self-timed clock signals $\overline{ST}$ for each corresponding row segments with proper delays.

For example, when CLK is asserted to logic high (e.g., VDD), a first match line segment ML(1) is discharged to logic low (e.g., ground potential) with an inherent delay from the compare operation of CAM cell 700(1). A first self-timed clock signal $\overline{ST1}$ is then pulled down to logic low from the logic low state of first match line segment ML(1) with another inherent delay from inverters INV1A and INV1B. The logic low state of first self-timed clock signal $\overline{ST1}$ propagates to regular CAM row 800 (see also FIG. 8) as clock enable to allow the second row segment REFSG2 to perform compare operations. Conversely, when CLK is de-asserted to logic low (e.g., ground potential), first match line segment ML(1) is charged back to logic high (e.g., VDD) with an inherent delay from the compare operation of CAM cell 700(1). The first self-timed clock signal $\overline{ST1}$ is then pulled up to logic high from the logic high state of the first match line segment ML(1) with another inherent delay from inverters INV1A and INV1B. The logic high state of first self-timed clock signal $\overline{ST1}$ then propagates to regular CAM rows 800 as clock disable to disallow row segment REFSG2 to perform compare operations. Because the inherent delays from logic operations and propagation are essentially the same for regular CAM rows 800, all self-timed clock signals $\overline{ST}$ each have a delay that is automatically synchronized with the timing of their associated CAM cells 700. The need for additional match line control circuitry is therefore removed. Together, regular CAM row 800 and reference CAM row 900 form a self-timed match line cascading CAM array design, which retains the power benefit of the partitioning technique embodied in FIG. 2 but without synchronized and pipelined match line control circuits.

Figure 10:
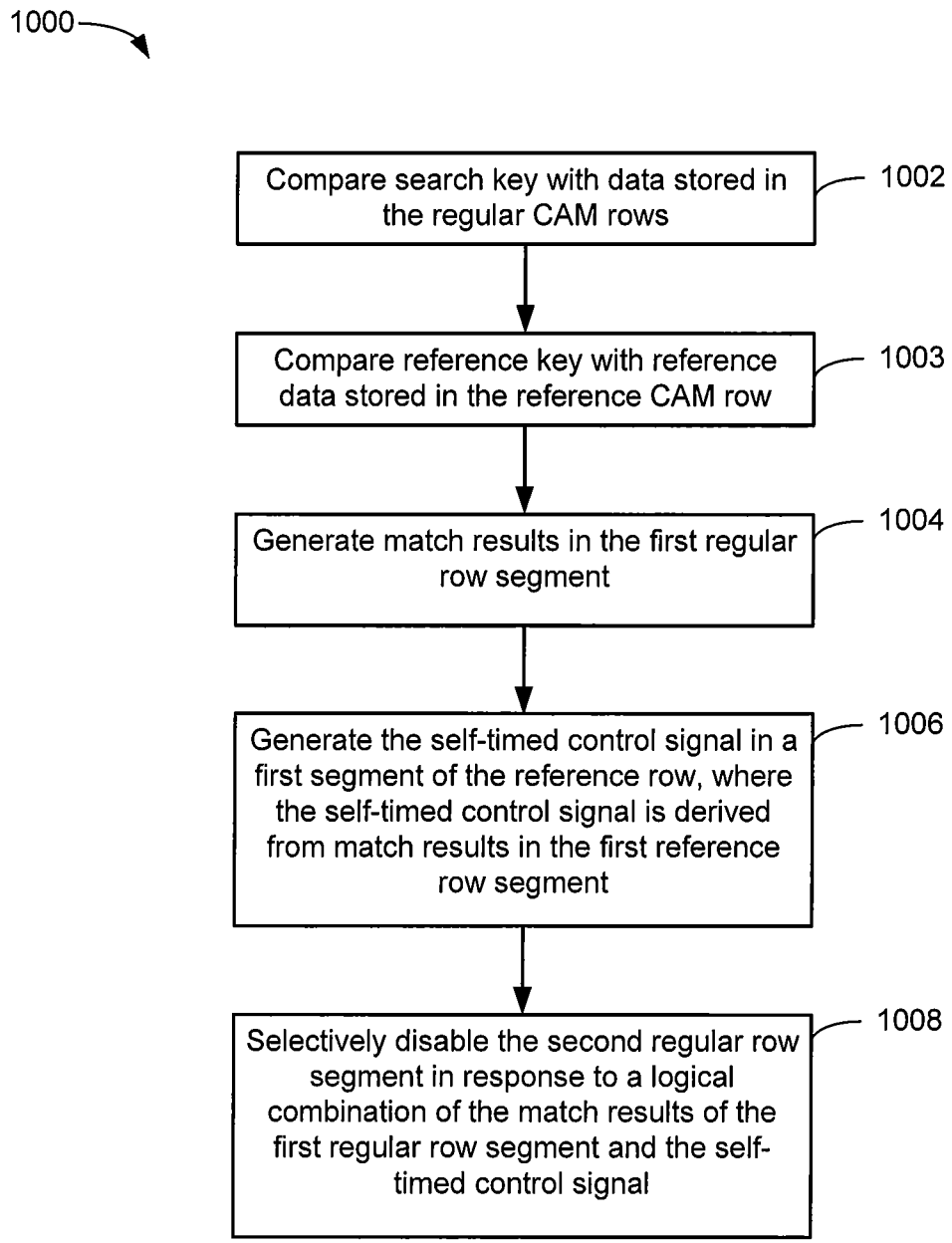
FIG. 10 depicts an illustrative search operation for an exemplary embodiment of the CAM array of FIG. 5.

FIG. 10 depicts an illustrative operation of the CAM array of FIG. 5 in which the row segments are selectively disabled in response to match results in previous row segments using self-timed control signals in accordance with some embodiments. First, a search key is compared with data stored in the regular CAM rows (1002), and a reference search key is compared with predetermined reference data stored in the reference CAM row (1003). Next, match results are generated in a first regular row segment (1004), and the self-timed control signal is generated in a first segment of the reference row (1006). Then, the second regular row segment is selectively disabled in response to a logical combination of the match results of the first regular row segment and the self-timed control signal (1008). This process is then repeated for subsequent segments of the CAM array.

It should also be understood that all block diagrams in the figures are for illustration purpose only, and should not preclude the scope of this disclosure from including any logic equivalents or combinations thereof, including removing, substituting, or adding other logic gates that achieves the same or similar functions consistent with the features of the present invention.

While particular embodiments have been shown and described, it will be obvious to those skilled in the art that changes and modifications may be made without departing from this disclosure in its broader aspects and, therefore, the appended claims are to encompass within their scope all such changes and modifications as fall within the true spirit and scope of this disclosure. For example, in other embodiments, the reference CAM row can be replaced by a delay path (e.g., a chain of serially-connected delay elements) that generates the self-timed control signals for each of the segments of the regular CAM rows.

Further, it should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media).

What is claimed is:

1. A content addressable memory (CAM) device including a CAM array comprising:
   a reference row including a plurality of reference CAM cells coupled to a reference match line, the reference match line configured to generate a self-timed control signal; and
   a plurality of regular rows, each comprising:
      a first row segment including a number of first CAM cells coupled to a first match line segment;

a second row segment including a number of second CAM cells coupled to a second match line segment; and a control circuit configured to selectively disable the second row segment in response to match results in the first row segment and the self-timed control signal, wherein the control circuit comprises:

a pull-down transistor coupled between the second CAM cells and ground potential, and having a gate; and a combinational logic gate having a first input coupled to the first match line segment, having a second input to receive the self-timed control signal, and having an output coupled to the gate of the pull-down transistor.

2. The CAM device of claim 1, wherein the control circuit is configured to disable the second row segment upon assertion of the self-timed control signal if there is a mismatch condition in the first row segment.

3. The CAM device of claim 2, wherein the control circuit is configured to disable the second row segment by preventing the second match line segment from being discharged toward ground potential, irrespective of match results in the second row segment.

4. The CAM device of claim 1, wherein the control circuit is configured to enable the second row segment upon assertion of the self-timed control signal if there is a match condition in the first row segment.

5. The CAM device of claim 4, wherein the control circuit is configured to enable the second row segment by allowing the second match line segment to be selectively discharged in response to match results in the second row segment.

6. The CAM device of claim 1, wherein the reference row is divided into at least first and second segments, wherein the first segment of the reference row includes a first subset of the reference CAM cells coupled to a first reference match line segment, and the second segment of the reference row includes a second subset of the reference CAM cells coupled to a second reference match line segment.

7. The CAM device of claim 6, wherein match results are generated on the first reference match line segment of the reference row and the first match line segment of the regular rows concurrently.

8. The CAM device of claim 1, wherein each regular row further comprises:

a combinational logic gate having a first input coupled to the first match line segment, having a second input coupled to the second match line segment, and an output to generate a match condition for the first and second row segments.

9. A content addressable memory (CAM) device including a CAM array comprising:

a reference row including a plurality of reference CAM cells coupled to a reference match line, the reference match line configured to generate a self-timed control signal; and a plurality of regular rows, each comprising:

a first row segment including a number of first CAM cells coupled to a first match line segment;

a second row segment including a number of second CAM cells coupled to a second match line segment; and a control circuit configured to selectively disable the second row segment in response to match results in the first row segment and the self-timed control signal, wherein the reference row is divided into at least first and second segments, wherein the first segment of the reference row includes a first subset of the reference CAM cells coupled to a first reference match line segment, and the second segment of the reference row includes a second subset of the reference CAM cells coupled to a second reference match line segment, and wherein match results are generated in the first reference match line segment of the reference row just after match results are generated on the first match line segment of the regular rows.

10. A content addressable memory (CAM) device including a CAM array comprising:

at least one regular row divided into a number N of regular row segments, wherein each regular row segment includes a plurality of CAM cells coupled to a corresponding match line segment;

a reference row divided into N reference row segments, wherein each reference row segment includes a plurality of reference CAM cells coupled to a corresponding reference match line segment; and a control circuit, coupled to the regular row and to the reference row, configured to selectively enable a next regular row segment in response to a logical combination of match results in a previous regular row segment and match results in a corresponding previous reference row segment, wherein the control circuit comprises:

a pull-down transistor coupled between the CAM cells of a respective regular row segment and ground potential, and having a gate; and a combinational logic gate having a first input coupled to the match line segment of a previous regular row segment, having a second input coupled to the reference match line segment of a previous reference row segment, and having an output coupled to the gate of the pull-down transistor.

11. The CAM device of claim 10, wherein a respective reference match line segment generates an associated self-timed control signal that comprises the match results in the respective reference row segment.

12. The CAM device of claim 11, wherein the control circuit is configured to disable the next regular row segment upon assertion of the associated self-timed control signal if there is a mismatch condition in the previous regular row segment.

13. The CAM device of claim 12, wherein the control circuit is configured to disable the next regular row segment by preventing the corresponding next match line segment from being discharged toward ground potential, irrespective of match results in the next regular row segment.

14. The CAM device of claim 10, wherein the control circuit is configured to enable the next regular row segment upon assertion of a self-timed control signal generated by the previous reference row segment if there is a match condition in the previous regular row segment.

15. The CAM device of claim 14, wherein the control circuit is configured to enable the next regular row segment by allowing the corresponding next match line segment to be selectively discharged in response to match results in the next regular row segment.

16. The CAM device of claim 10, wherein each row further comprises:

a combinational logic gate having a first input coupled to a last match line segment, having a second input coupled to a next-to-last match line segment, and having an output to generate a match condition for the row.

17. A content addressable memory (CAM) array including a plurality of regular rows, each regular row comprising:
- a first row segment including a number of first CAM cells coupled to a first match line segment;
- a second row segment including a number of second CAM cells coupled to a second match line segment; and
- a control circuit configured to selectively disable the second row segment in response to match results in the first row segment and a self-timed control signal generated by a reference row of CAM cells,
- wherein the control circuit comprises:
- a pull-down transistor coupled between the second CAM cells and ground potential, and having a gate; and
- a combinational logic gate having a first input coupled to the first match line segment, having a second input to receive the self-timed control signal, and having an output coupled to the gate of the pull-down transistor.

18. The CAM device of claim 17, wherein the reference row comprises:
- a first reference row segment including a number of first reference CAM cells coupled to a first reference match line segment; and
- a second reference row segment including a number of second reference CAM cells coupled to a second reference match line segment.

19. The CAM device of claim 18, wherein the first reference match line segment generates the self-timed control signal.

20. The CAM device of claim 17, wherein the control circuit is configured to disable the second row segment upon assertion of the self-timed control signal if there is a mismatch condition in the first row segment.

21. The CAM device of claim 20, wherein the control circuit is configured to disable the second row segment by preventing the second match line segment from being discharged toward ground potential, irrespective of match results in the second row segment.

22. The CAM device of claim 17, wherein the control circuit is configured to enable the second row segment upon assertion of the self-timed control signal if there is a match condition in the first row segment.

23. The CAM device of claim 22, wherein the control circuit is configured to enable the second row segment by allowing the second match line segment to be selectively discharged in response to match results in the second row segment.

24. The CAM device of claim 17, wherein each row further comprises:
- a combinational logic gate laving a first input coupled to the first match line segment, having a second input coupled to the second match line segment, and an output to generate a match condition for the first and second row segments.

25. A method for selectively disabling at least one of a plurality of segments of a regular row within a content addressable memory (CAM) array, wherein each regular row segment includes a plurality of CAM cells coupled to an associated match line segment, the method comprising:
- generating match results in a first regular row segment;
- generating a self-timed control signal in a first segment of a reference row that includes a number of reference CAM cells coupled to an associated reference match line segment, wherein the reference row is divided into at least first and second segments, wherein the first segment of the reference row includes a first subset of the reference CAM cells coupled to a first reference match line segment, and the second segment of the reference row includes a second subset of the reference CAM cells coupled to a second reference match line segment, and wherein the generating a self-timed control signal comprises generating match results on the first reference match line segment of the reference row just after match results are generated in the first regular row segment; and
- selectively disabling a second regular row segment in response to a logical combination of the match results of the first regular row segment and the self-timed control signal.

26. The method of claim 25, wherein the self-timed control signal comprises match results provided on the associated reference match line segment.

27. The method of claim 25, wherein the second regular row segment is disabled upon assertion of the self-timed control signal if there is a mismatch condition in the first regular row segment.

28. The method of claim 27, wherein the second regular row segment is disabled by:
- preventing the match line segment of the second regular row segment from being discharged toward ground potential irrespective of match results in the second regular row segment.

29. The method of claim 25, wherein the second regular row segment is enabled upon assertion of the self-timed control signal if there is a match condition in the first regular row segment.

30. The method of claim 29, wherein the second regular row segment is enabled by:
- allowing the match line segment of the second regular row segment to he selectively discharged in response to match results in the second regular row segment.

* * * * *

UNITED STATES PATENT AND TRADEMARK OFFICE
CERTIFICATE OF CORRECTION

| | | |
|---|---|---|
| PATENT NO. | : 8,493,763 B1 | |
| APPLICATION NO. | : 13/283422 | |
| DATED | : July 23, 2013 | |
| INVENTOR(S) | : Dimitri Argyres | |

It is certified that error appears in the above-identified patent and that said Letters Patent is hereby corrected as shown below:

In the Claims

Column 18, Line 48, please replace "he" with --be--.

Signed and Sealed this
First Day of October, 2013

Teresa Stanek Rea
*Deputy Director of the United States Patent and Trademark Office*